United States Patent
Ock

(10) Patent No.: US 11,380,416 B2
(45) Date of Patent: Jul. 5, 2022

(54) STORAGE DEVICE AND OPERATING METHOD THEREOF

(71) Applicant: SK hynix Inc., Gyeonggi-do (KR)

(72) Inventor: Eun Jae Ock, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 17/233,689

(22) Filed: Apr. 19, 2021

(65) Prior Publication Data

US 2022/0115082 A1  Apr. 14, 2022

(30) Foreign Application Priority Data

Oct. 12, 2020  (KR) .......................... 10-2020-0131463

(51) Int. Cl.
| | | |
|---|---|---|
| G11C 29/42 | (2006.01) | |
| G11C 29/24 | (2006.01) | |
| G11C 29/02 | (2006.01) | |
| G11C 16/28 | (2006.01) | |
| G11C 16/10 | (2006.01) | |
| G11C 16/16 | (2006.01) | |
| G11C 29/12 | (2006.01) | |

(52) U.S. Cl.
CPC ............ *G11C 29/42* (2013.01); *G11C 16/102* (2013.01); *G11C 16/16* (2013.01); *G11C 16/28* (2013.01); *G11C 29/021* (2013.01); *G11C 29/12005* (2013.01); *G11C 29/24* (2013.01)

(58) Field of Classification Search
CPC ....... G11C 16/102; G11C 5/144; G11C 5/148; G11C 29/42; G11C 16/16; G11C 16/28
See application file for complete search history.

(56) References Cited

U.S. PATENT DOCUMENTS

| | | | |
|---|---|---|---|
| 2019/0295655 A1* | 9/2019 | Shin | ................. G11C 11/5628 |
| 2020/0233739 A1* | 7/2020 | Oh | ..................... G06F 11/0751 |

FOREIGN PATENT DOCUMENTS

| | | |
|---|---|---|
| KR | 10-1655306 | 9/2016 |
| KR | 10-1689185 | 12/2016 |
| KR | 10-2019-0057810 | 5/2019 |
| KR | 10-2019-0110866 | 10/2019 |

* cited by examiner

*Primary Examiner* — Han Yang
(74) *Attorney, Agent, or Firm* — IP & T Group LLP

(57) ABSTRACT

A storage device may include a memory device and a memory controller. The memory device may include a memory block including a plurality of pages. When a sudden power off is detected in which power supplied to the memory device is abnormally interrupted during a normal program operation on one page among the plurality of pages, the memory controller may control the memory device to perform a dummy program operation on a selected page among the plurality of pages after the sudden power-off. The memory controller may control the memory device to perform the normal program operation and the dummy program operation by using an Incremental Step Pulse Program (ISPP) method. The memory controller may control the memory device to perform the dummy program operation in a smaller number of program loops as compared with the normal program operation.

20 Claims, 16 Drawing Sheets

STORAGE DEVICE AND OPERATING METHOD THEREOF

CROSS-REFERENCE TO RELATED APPLICATION

The present application claims priority under 35 U.S.C. § 119(a) to Korean patent application number 10-2020-0131463 filed on Oct. 12, 2020, the entire disclosure of which is incorporated by reference herein.

BACKGROUND

Field of Invention

The present disclosure generally relates to an electronic device, and more particularly, to a storage device and an operating method thereof.

Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Embodiments of the present disclosure provide a storage device having improved dummy program performance and an operating method for the storage device.

In accordance with an aspect of the present disclosure, there is provided a storage device including: a memory device having a memory block including a plurality of pages; and a memory controller configured to, when a sudden power off is detected in which power supplied to the memory device is abnormally interrupted during a normal program operation on one page among the plurality of pages, control the memory device to perform a dummy program operation on a selected page among the plurality of pages after the sudden power-off, wherein the memory controller controls the memory device to perform the normal program operation and the dummy program operation by using an Incremental Step Pulse Program (ISPP) method, and wherein the memory controller controls the memory device to perform the dummy program operation in a smaller number of program loops as compared with the normal program operation.

In accordance with another aspect of the present disclosure, there is provided a method for operating a storage device including a memory block including a plurality of pages, the method including: detecting a sudden power-off in which power supplied to the storage device is abnormally interrupted during a normal program operation on one page among the plurality of pages; and performing a dummy program operation on a selected page among the plurality of pages after the sudden power-off, wherein the normal program operation and the dummy program operation are performed by using an Incremental Step Pulse Program (ISPP) method, and wherein the dummy program operation is performed in a smaller number of program loops as compared with the normal program operation.

In accordance with still another aspect of the present disclosure, there is provided a memory controller for controlling a memory device including a memory block, the memory controller including: a power manager configured to generate power-off information when a sudden power-off is detected in which power supplied to the memory device is abnormally interrupted during a normal program operation on one page among the plurality of pages; and a program operation controller configured to control, when the power-off information is received, the memory device to perform a dummy program operation on a selected page among a plurality of pages included in the memory device after the sudden power-off, wherein the program operation controller controls the memory device to perform the normal program operation and the dummy program operation by using an Incremental Step Pulse Program (ISPP) method, and wherein the program operation controller controls the memory device to perform the dummy program operation in a smaller number of program loops as compared with the normal program operation.

In accordance with another aspect of the present disclosure, there is provided a method for operating a controller, the operating method comprising controlling a nonvolatile memory device to perform any of first and second program operations on a memory block according to an incremental step pulse program (ISPP) scheme, wherein the controlling includes controlling the device to perform the second program operation with a smaller number of program loops of at least one of a greater program start voltage and a greater step voltage than the first program operation by determining at least one of the program start voltage and the step voltage for the second program operation based on at least one of a read count, an erase/write count and a read reclaim count of the memory block.

BRIEF DESCRIPTION OF THE DRAWINGS

Various embodiments will now be described more fully hereinafter with reference to the accompanying drawings; however, the embodiments may be implemented in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the present disclosure. The embodiments according to the present disclosure can be implemented in various forms, and should not be construed as limited to the embodiments set forth herein.

Figure 1:
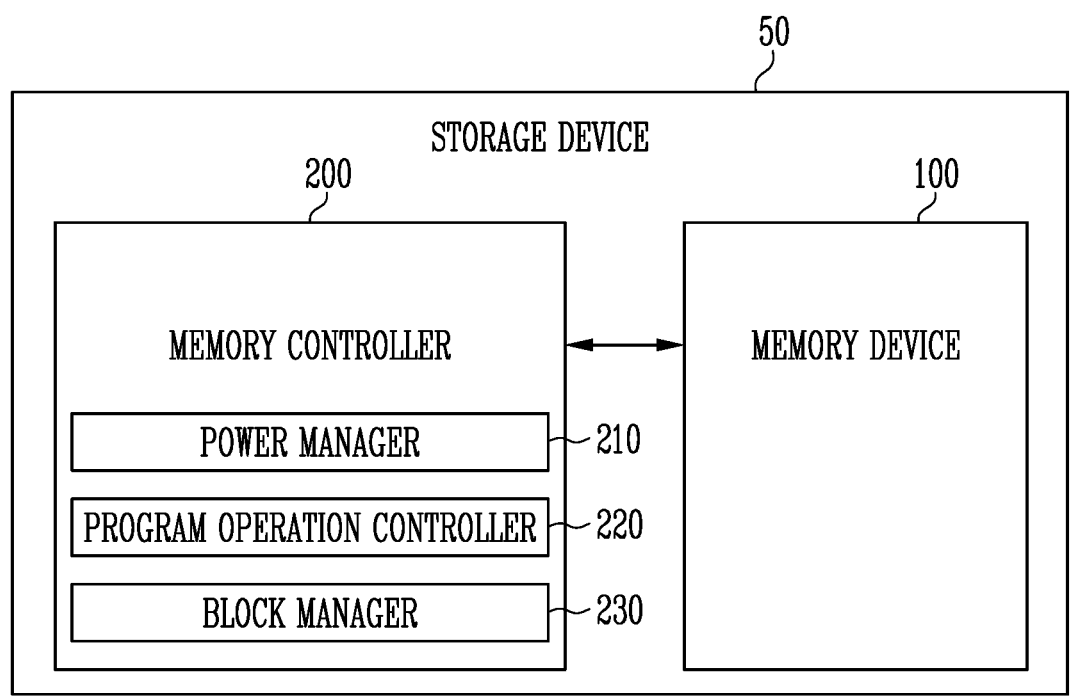
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control an operation of the memory device 100. The storage device 50 may be a device for storing data under the control of a host, such as a mobile phone, a smart phone, an MP3 player, a laptop computer, a desktop computer, a game console, a TV, a tablet PC or an in-vehicle infotainment.

The storage device 50 may be manufactured as any of various types of storage devices according to a host interface that is a communication scheme with the host. For example, the storage device 50 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any of various types of package types. For example, the storage device 50 may be manufactured as any of various types of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SDRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control overall operations of the storage device 50.

When power is applied to the storage device 50, the memory controller 200 may execute firmware (FW). When the memory device 100 is a flash memory, the memory controller 200 may execute FW such as a Flash Translation Layer (FTL) for controlling communication between the host and the memory device 100.

In an embodiment, the memory controller 200 may receive data and a Logical Block Address (LBA) from the host, and translate the LBA into a Physical Block Address (PBA) representing addresses of memory cells included in the memory device 100, in which data is to be stored.

The memory controller 200 may control the memory device 100 to perform a program operation, a read operation, an erase operation, or the like in response to a request from the host. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data regardless of any request being received from the host, and transmit the command, the address, and the data to the memory device 100. For example, the memory controller 200 may provide the command, the address, and the data to the memory device 100 to perform background operations such as a program operation for wear leveling and a program operation for garbage collection.

In an embodiment, the memory controller 200 may control at least two memory devices 100. The memory controller 200 may control at least two memory devices 100 according to an interleaving scheme to improve operational performance. The interleaving scheme may be an operating scheme that allows operation periods of at least two memory devices 100 to overlap with each other.

In an embodiment, the memory device 100 may include a memory block including a plurality of pages.

The memory controller 200 may detect a sudden power-off during a normal program operation on any page among the plurality of pages. The sudden power-off means a case where power supplied to the storage device 50 is abnormally interrupted due to an unexpected power error during an operation of the storage device 50. The memory controller 200 may determine that the sudden power-off has occurred, when a level of power supplied to the storage device 50 for a reference time is lower than a reference level. The memory controller 200 may control the memory device 100 to perform a dummy program operation on a selected page among the plurality of pages after the sudden power-off. The dummy program operation may be performed during a recovery operation of recovering the storage device 50 for the sudden power-off of the storage device 50. As will be described in FIG. 8, the selected page may be determined based on a first erased page in the memory block.

The memory controller 200 may control the memory device 100 to perform the normal program operation and the dummy program operation by using an Incremental Step Pulse Program (ISPP) method which will be described in FIG. 7.

As will be described in FIG. 9, the memory controller 200 may control the memory device 100 to perform the dummy program operation in a smaller number of program loops, as compared with the normal program operation. The memory controller 200 may set a program start voltage of the dummy program operation to be higher than that of the normal program operation. The memory controller 200 may set a step voltage of the dummy program operation to be higher than that of the normal program operation. Therefore, the dummy program operation may be performed within a shorter time than the normal program operation.

The memory controller 200 may perform Error Correction Code (ECC) encoding on data to be programmed in the normal program operation. The memory controller 200 may skip the ECC encoding on dummy data to be programmed in the dummy program operation.

The memory controller 200 may perform randomizing on data to be programmed in the normal program operation. The memory controller 200 may skip randomizing on dummy data to be programmed in the dummy program operation.

As will be described in FIG. 10, the memory controller 200 may dynamically set the program start voltage and the step voltage according to a degree of degradation of the memory block. For example, in the dummy program operation, the memory controller 200 may increase at least one of the program start voltage and the step voltage as the degree of degradation of the memory block increases.

The memory controller 200 may determine the degree of degradation of the memory block, based on at least one of a read count, an erase/write count, and a read reclaim count of the memory block.

In an embodiment, the memory controller 200 may include a power manager 210, a program operation controller 220, and a block manager 230.

The power manager 210 may detect a sudden power-off of the memory device 100. When the sudden power-off is detected during a normal program operation on any page among a plurality of pages included in a memory block, the power manager 210 may generate power-off information representing that the sudden power-off has been detected.

When the program operation controller 220 receives the power-off information from the power manager 210, the program operation controller 220 may control the memory device to perform a dummy program operation on a selected page among the plurality of pages after the sudden power-off.

The program operation controller 220 may control the memory device 100 to perform the normal program operation and the dummy program operation by using an Incremental Step Pulse Program (ISPP) method. The dummy program operation may be performed in a smaller number of program loops, as compared with the normal program operation.

The program operation controller 220 may set a program start voltage of the dummy program operation to be higher than that of the normal program operation. The program operation controller 220 may set a step voltage of the dummy program operation to be higher than that of the normal program operation. The program operation controller 220 may dynamically set the program start voltage and the step voltage of the dummy program operation according to a degree of degradation of the memory block.

The block manager 230 may determine the degree of degradation of the memory block, based on at least one of a read count, an erase/write count, and a read reclaim count of the memory block. The block manager 230 may provide the program operation controller 220 with information on the determined degree of degradation of the memory block.

The host may communicate with the storage device 50, using at least one of various communication interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
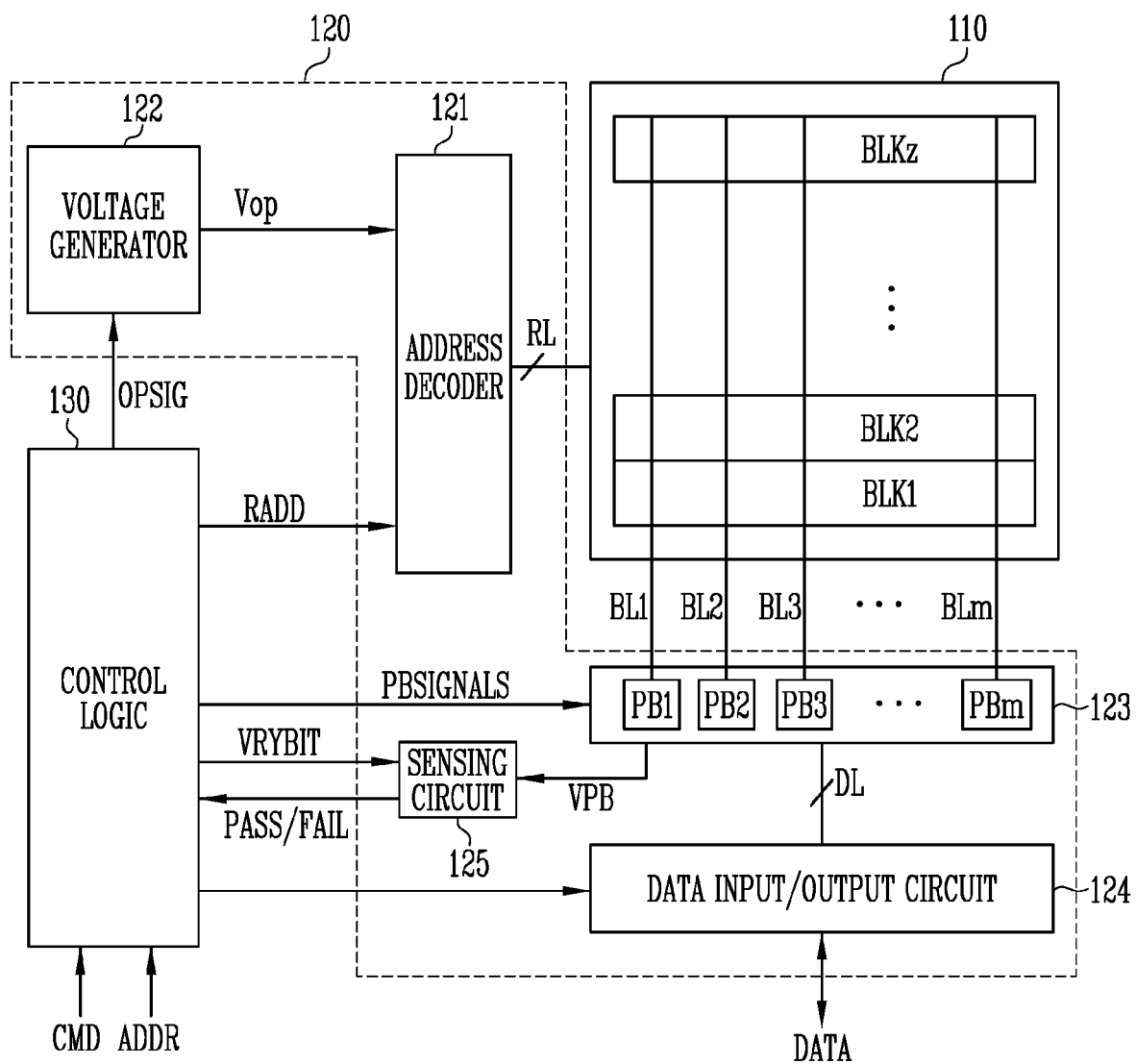
FIG. 2 is a diagram illustrating a structure of a memory device shown in FIG. 1.

FIG. 2 is a diagram illustrating a structure of the memory device shown in FIG. 1.

Referring to FIG. 2, the memory device 100 may include a memory cell array 110, a peripheral circuit 120, and a control logic 130.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells connected to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz included in the memory cell array 110 may include a plurality of dummy cells. One or more dummy cells may be connected in series between a drain select transistor and memory cells, and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a memory block selected according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least one memory block according to the decoded block address. In the erase operation, the address decoder 121 may apply a ground voltage to word lines connected to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130.

The plurality of generated operating voltages Vop may be supplied to the memory cell array 110 by the address decoder 121.

The read/write circuit 123 includes first to mth page buffers PB1 to PBm. The first to mth page buffers PB1 to PBm are connected to the memory cell array 110 through the respective first to mth bit lines BL1 to BLm. The first to mth page buffers PB1 to PBm operate under the control of the control logic 130.

The first to mth page buffers PB1 to PBm communicate data DATA with the data input/output circuit 124 through data lines DL. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The selected memory cells are programmed according to the transferred data DATA. A memory cell connected to a bit line through which a program allow voltage (e.g., a ground voltage) is applied may have an increased threshold voltage. A threshold voltage of a memory cell connected to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL1 to BLm, and store the read data DATA in the first to mth page buffers PB1 to PBm.

In an erase operation, the read/write circuit 123 may float the bit lines BL1 to BLm. In an embodiment, the read/write circuit 123 may include a column select circuit.

The data input/output circuit 124 is connected to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal PASS or fail signal FAIL to the control logic 130 by comparing a sensing voltage VPB received from the read/write circuit 123 and a reference voltage generated by the reference current.

The control logic 130 may be connected to the address decoder 121, the voltage generator 122, the read/write circuit 123, the data input/output circuit 124, and the sensing circuit 125. The control logic 130 may control overall operations of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

Figure 3:
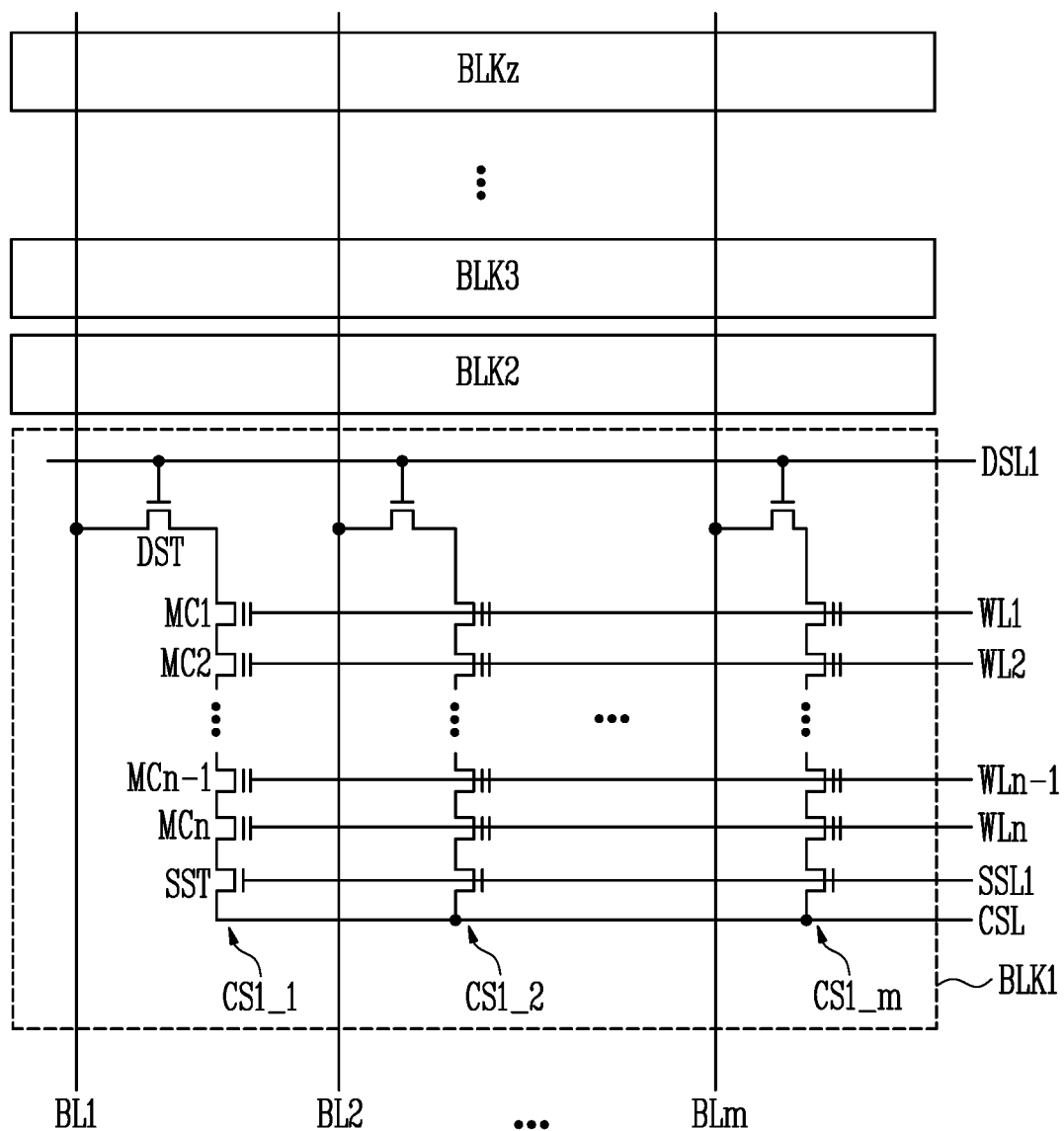
FIG. 3 is a diagram illustrating a memory cell array shown in FIG. 2.

FIG. 3 is a diagram illustrating the memory cell array shown in FIG. 2.

Referring to FIG. 3, first to zth memory blocks BLK1 to BLKz are commonly connected to the first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The first memory block BLK1 may include a plurality of cell strings CS1_1 to CS1_m (m is a positive integer). First to mth cell strings CS1_1 to CS1_m are respectively connected to the first to mth bit lines BL1 to BLm. Each of the first to mth cell strings CS1_1 to CS1_m includes a drain select transistor DST, a plurality of memory cells MC1 to MCn (n is a positive integer), and a source select transistor SST, which are connected in series.

A gate terminal of the drain select transistor DST included in each of the first to mth cell strings CS1_1 to CS1_m is connected to a drain select line DSL1. Gate terminals of first to nth memory cells MC1 to MCn included in each of the first to mth cell strings CS1_1 to CS1_m are respectively connected to first to nth word lines WL1 to WLn. A gate terminal of the source select transistor SST included in each of the first to mth cell strings CS1_1 to CS1_m is connected to a source select line SSL1.

For convenience of description, a structure of a cell string will be described based on the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST included in the first cell string CS1_1 is connected to the first bit line BL1. A source electrode of the drain select transistor DST included in the first cell string CS1_1 is connected to a drain terminal of the first memory cell MC1 included in the first cell string CS1_1. The first to nth memory cells MC1 to MCn are connected in series to each other. A drain terminal of the source select transistor SST included in the first cell string CS1_1 is connected to a source terminal of the nth memory cell MCn included in the first cell string CS1_1. A source terminal of the source select transistor SST included in the first cell string CS1_1 is connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 are included in the row lines RL shown in FIG. 2. The drain select line DSL1, the first to nth word lines WL1 to WLn, and the source select line SSL1 are controlled by the address decoder 121 shown in FIG. 2. The common source line CSL may be controlled by the control logic 130 shown in FIG. 2. The first to mth bit lines BL1 to BLm are controlled by the read/write circuit 123 shown in FIG. 2.

Figure 4:
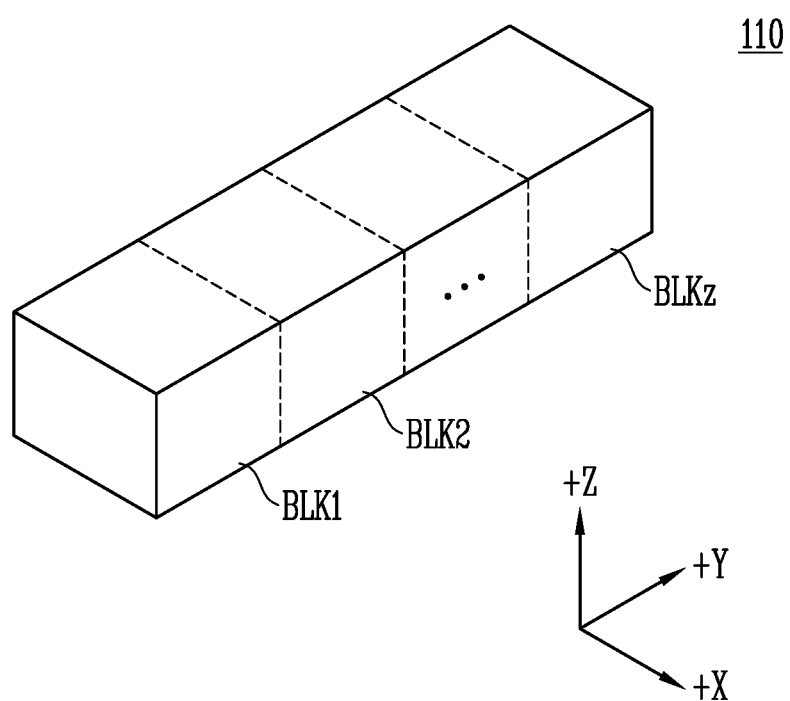
FIG. 4 is a diagram illustrating another embodiment of the memory cell array shown in FIG. 2.

FIG. 4 is a diagram illustrating another embodiment of the memory cell array shown in FIG. 2.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

Figure 5:
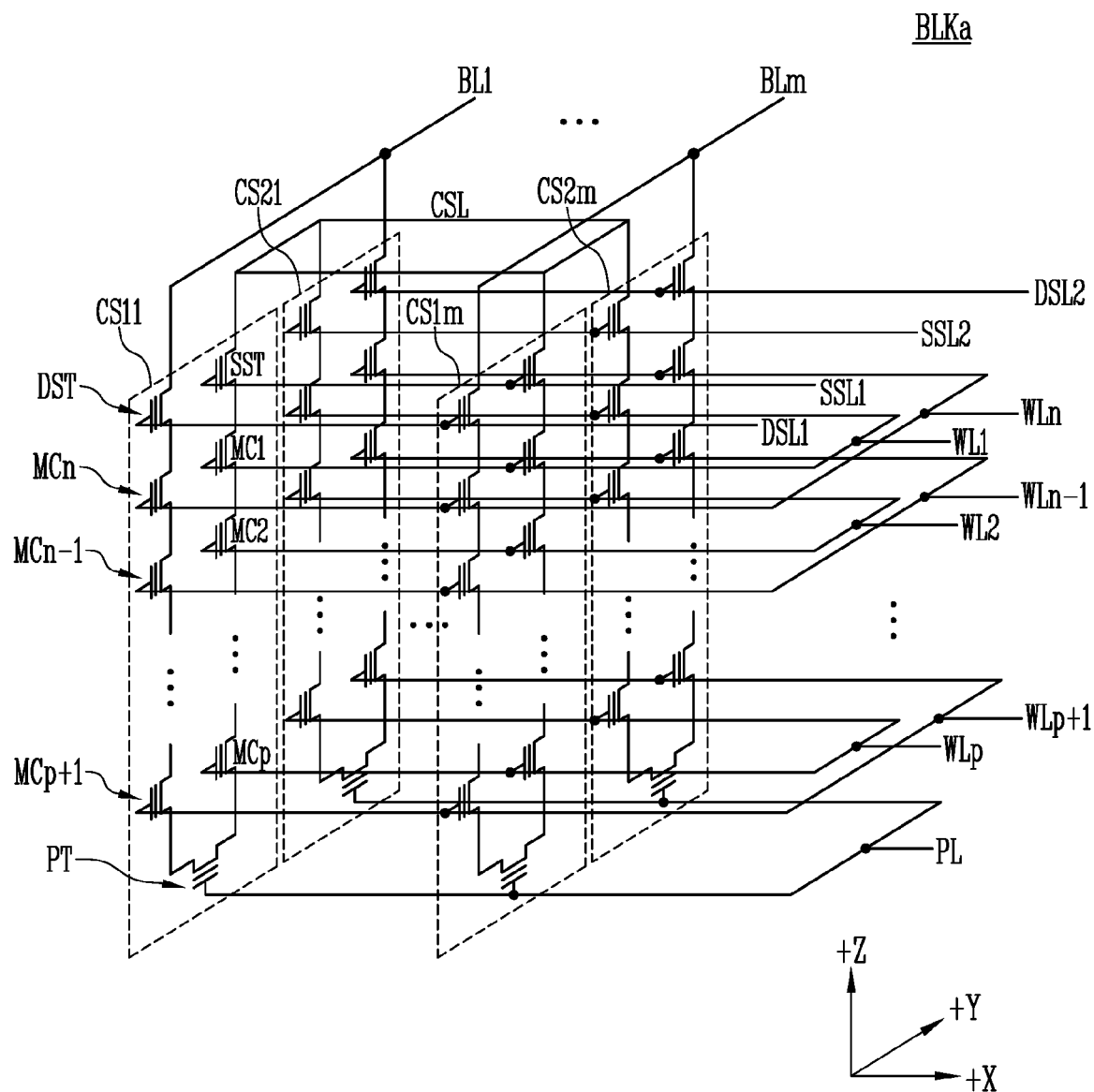
FIG. 5 is a circuit diagram illustrating one memory block among memory blocks shown in FIG. 4.

FIG. 5 is a circuit diagram illustrating one memory block BLKa among the memory blocks BLK1 to BLKz shown in FIG. 4.

Referring to FIG. 5, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 5 illustrates two cell strings arranged in a column direction (i.e., a +Y direction). However, this is for convenience of description, and it will be understood that three cell strings may be arranged in the column direction.

In an embodiment, one memory block may include a plurality of sub-blocks. One sub-block may include cell strings arranged in a 'U' shape on one column.

Each of the plurality of cell strings CS11 to CS1m and CS21 to CS2m may include at least one source select transistor SST, first to nth memory cells MC1 to MCn, a pipe transistor PT, and at least one drain select transistor DST.

The select transistors SST and DST and the first to nth memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 5, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. The drain select transistors of cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 5, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As one of the drain select lines DSL1 and DSL2 is selected, cell strings arranged in one row direction may be selected. As one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
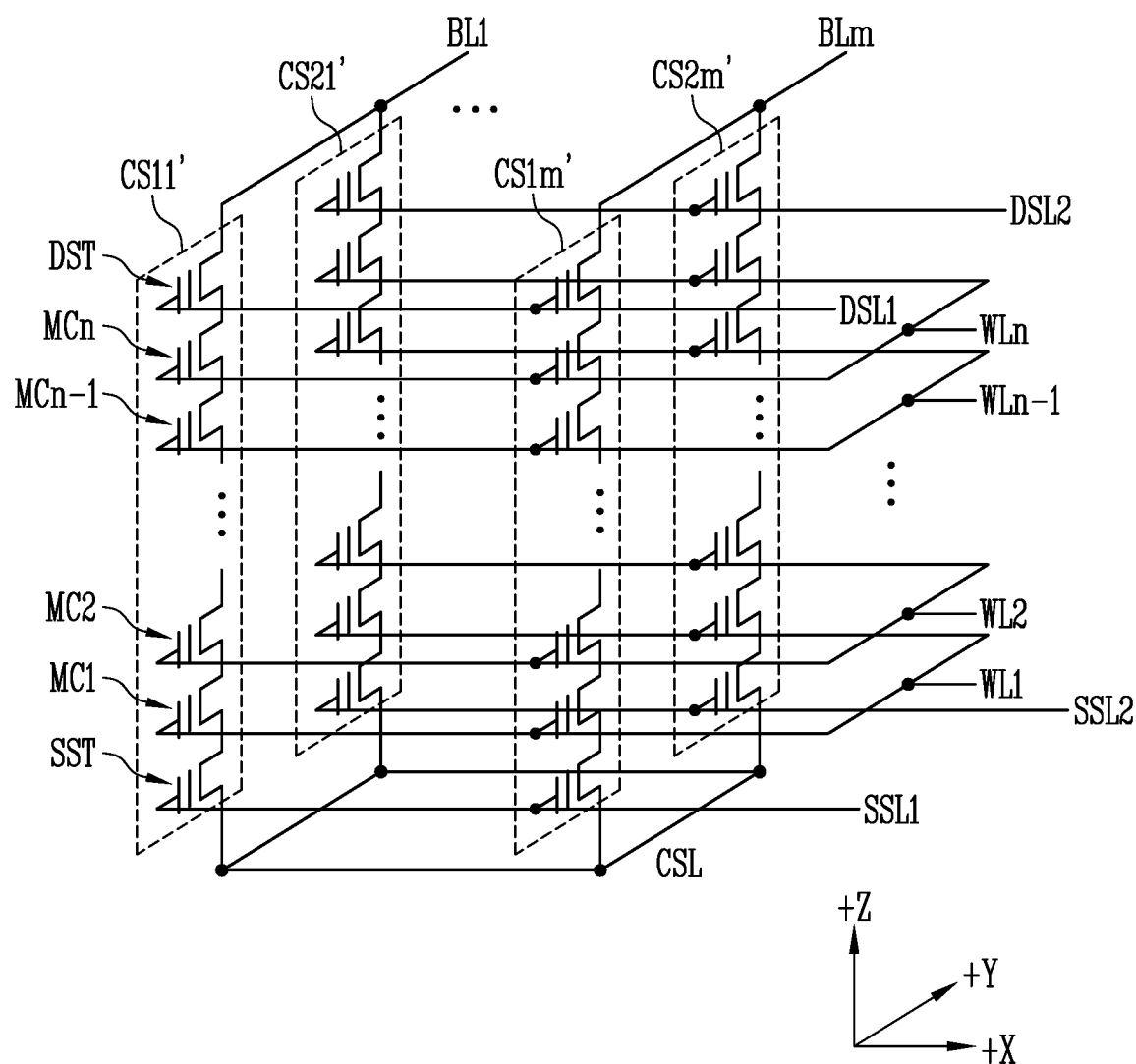
FIG. 6 is a circuit diagram illustrating another embodiment of the one memory block among the memory blocks shown in FIG. 4.

FIG. 6 is a circuit diagram illustrating another embodiment BLKb of the one memory block among the memory blocks BLK1 to BLKz shown in FIG. 4.

Referring to FIG. 6, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

In an embodiment, one memory block may include a plurality of sub-blocks. One sub-block may include cell strings arranged in an 'I' shape on one column.

The source select transistor SST of each cell string is connected between a common source line CSL and the first to nth memory cells MC1 to MCn. The source select transistors of cell strings arranged on the same row are connected to the same source select line. The source select transistors of the cell strings CS11' to CS1m' arranged on a first row are connected to a first source select line SSL1.

Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the first to nth memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 6 has a circuit similar to that of the memory block BLKa of FIG. 5, except that the pipe transistor PT is excluded from each cell string in FIG. 6.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 7:
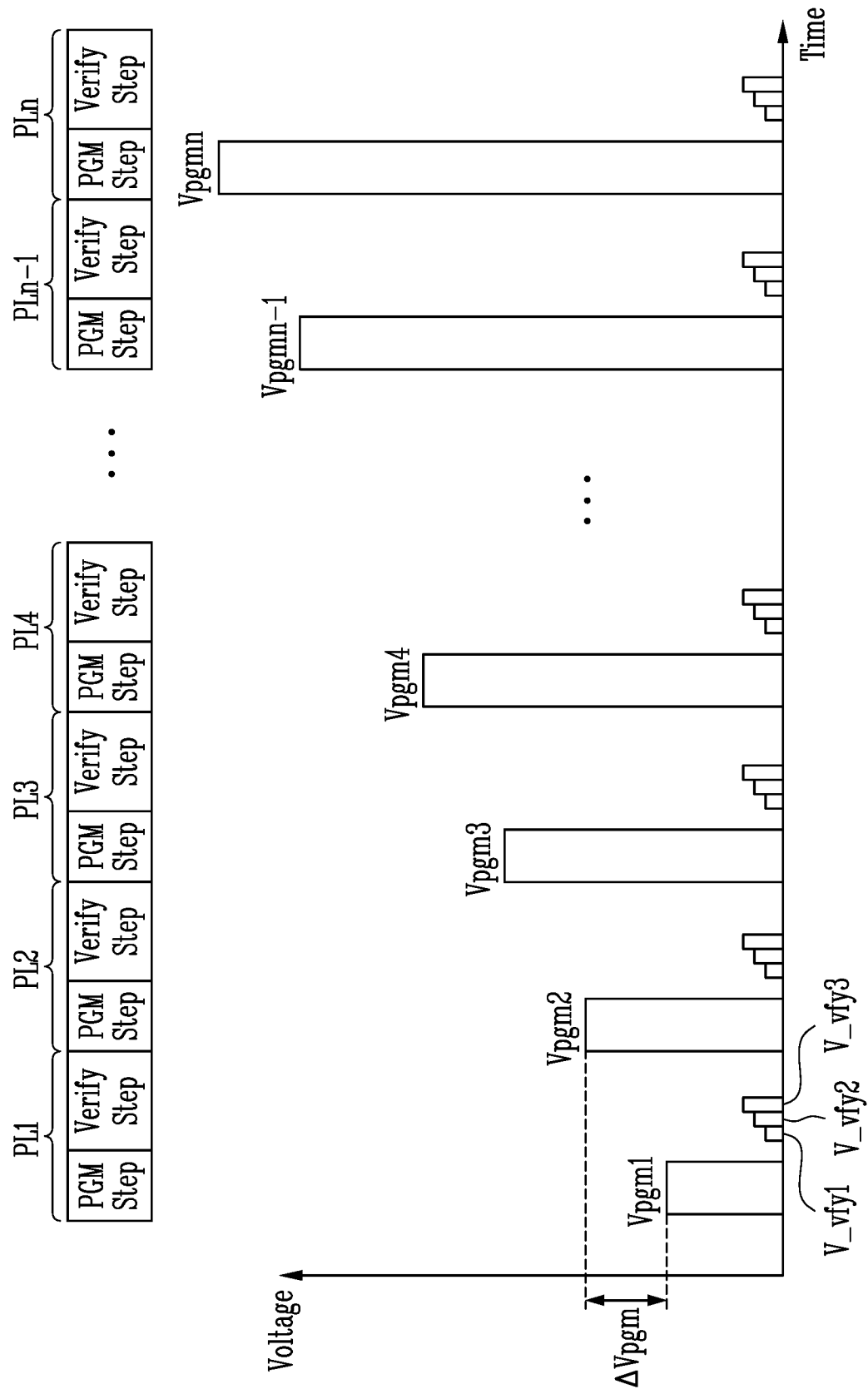
FIG. 7 is a diagram illustrating an Incremental Step Pulse Program (ISPP).

FIG. 7 is a diagram illustrating an Incremental Step Pulse Program (ISPP).

In FIG. 7, for convenience of description, each memory cell is a Multi-Level Cell (MLC) storing two-bit data. However, the scope of the present disclosure is not limited thereto, and the memory cell may be a Triple Level Cell (TLC) storing three-bit data or a Quad Level Cell (QLC) storing four-bit data. A number of data bits which the memory cell stores may be one or more.

The memory device may program selected memory cells to have a threshold voltage corresponding to any state among a plurality of program states P1, P2, and P3 by performing a plurality of program loops PL1 to PLn.

Each of the plurality of program loops PL1 to PLn may include a program voltage apply step PGM Step of applying a program voltage to a selected word line connected to the selected memory cells and a program verify step Verify Step of determining whether memory cells have been programmed by applying verify voltages.

For example, when a first program loop PL1 is performed, first to third verify voltages V_vfy1 to V_vfy3 are sequentially applied to verify a program state of the selected memory cells after a first program voltage Vpgm1 is applied. Memory cells of which a target program state is a first program state P1 may be verified by the first verify voltage V_vfy1, memory cells of which a target program state is a second program state P2 may be verified by the second verify voltage V_vfy2, and memory cells of which a target program state is a third program state P3 may be verified by the third verify voltage V_vfy3.

It may be determined that the memory cells verify-passed by each of the verify voltages V_vfy1 to V_vfy3 have the target program state. Then, the memory cells may be program-inhibited in a second program loop PL2. In other words, a program inhibit voltage may be applied to a bit line connected to a memory cell verify-passed in the second program loop PL2.

A second program voltage Vpgm2 higher by a unit voltage $\Delta$Vpgm than the first program voltage Vpgm1 is applied to the selected word line to program the other memory cells except the memory cells program-inhibited in the second program loop PL2. Subsequently, a verify operation is performed identically to that of the first program loop PL1. Further, verify pass indicates that a memory cell is read as an off-cell by a corresponding verify voltage.

As described above, when the memory device programs a Multi-Level Cell (MLC) storing two data bits, the memory device verify memory cells having program states as target program states by respectively using the first to third verify voltages V_vfy1 to V_vfy3.

In a verify operation, a verify voltage is applied to a selected word line as a word line to which selected memory cells are connected, and the page buffer shown in FIG. 2 may determine whether memory cells have been verify-passed, based on a current flowing through or a voltage applied to bit lines respectively connected to the selected memory cells.

In the ISPP, since a program verify operation is performed for every program loop, a threshold voltage distribution of a memory cell can be formed with high accuracy. A time at which a program inhibit voltage is applied to a bit line connected to the memory cell may be determined based on a result obtained by performing the program verify operation.

Figure 8:
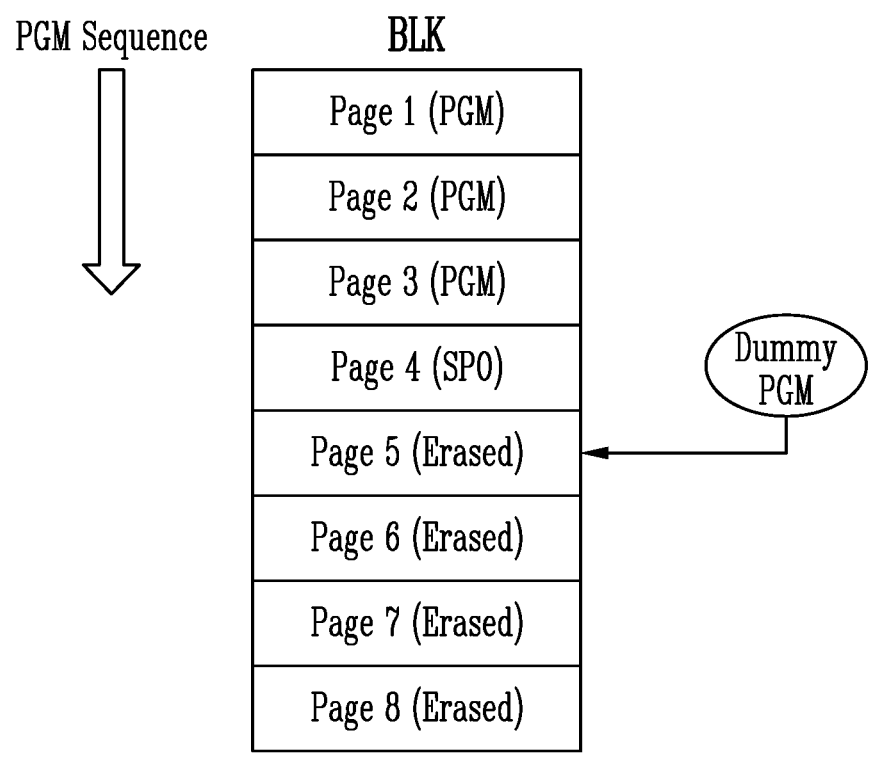
FIG. 8 is a diagram illustrating a dummy program operation performed after sudden power-off.

FIG. 8 is a diagram illustrating a dummy program operation performed after a sudden power-off.

Referring to FIG. 8, a memory block BLK may include first to eighth pages Page 1 to Page 8. A number of pages included in the memory block BLK is not limited to this embodiment.

In FIG. 8, a normal program operation may be sequentially performed in a sequence from the first page Page 1 to the eighth page Page 8. The first to third pages Page 1 to Page 3 may be in a state in which the normal program operation on the first to third pages Page 1 to Page 3 has been completed. Sudden Power-Off (SPO) may be detected during the normal program operation on the fourth page Page 4.

A dummy program operation may be performed on a selected page after the sudden power off SOP. The selected page may be determined based on a first erased page in the memory block. In the present disclosure, the first erase page is defined as a first page in a program sequence PGM Sequence among erased pages on which the normal program operation is not performed in the memory block due to the sudden power-off. In FIG. 8, the first erased page may be the fifth page Page 5. FIG. 8 illustrates an example that the first erased page Page 5 is determined as the selected page.

Since the selected page is determined based on the first erased page, the memory block may include at least one page including the first erased page.

In FIG. 8, the selected page may be the fifth page Page 5, and the dummy program operation may be performed on the fifth page Page 5.

In various embodiments, the dummy program operation may be performed on the fifth page Page 5 as the first erased page and the sixth to eighth pages Page 6 to Page 8 adjacent to the fifth page Page 5. A number of pages on which the dummy program operation is performed is not limited to this embodiment.

Figure 9:
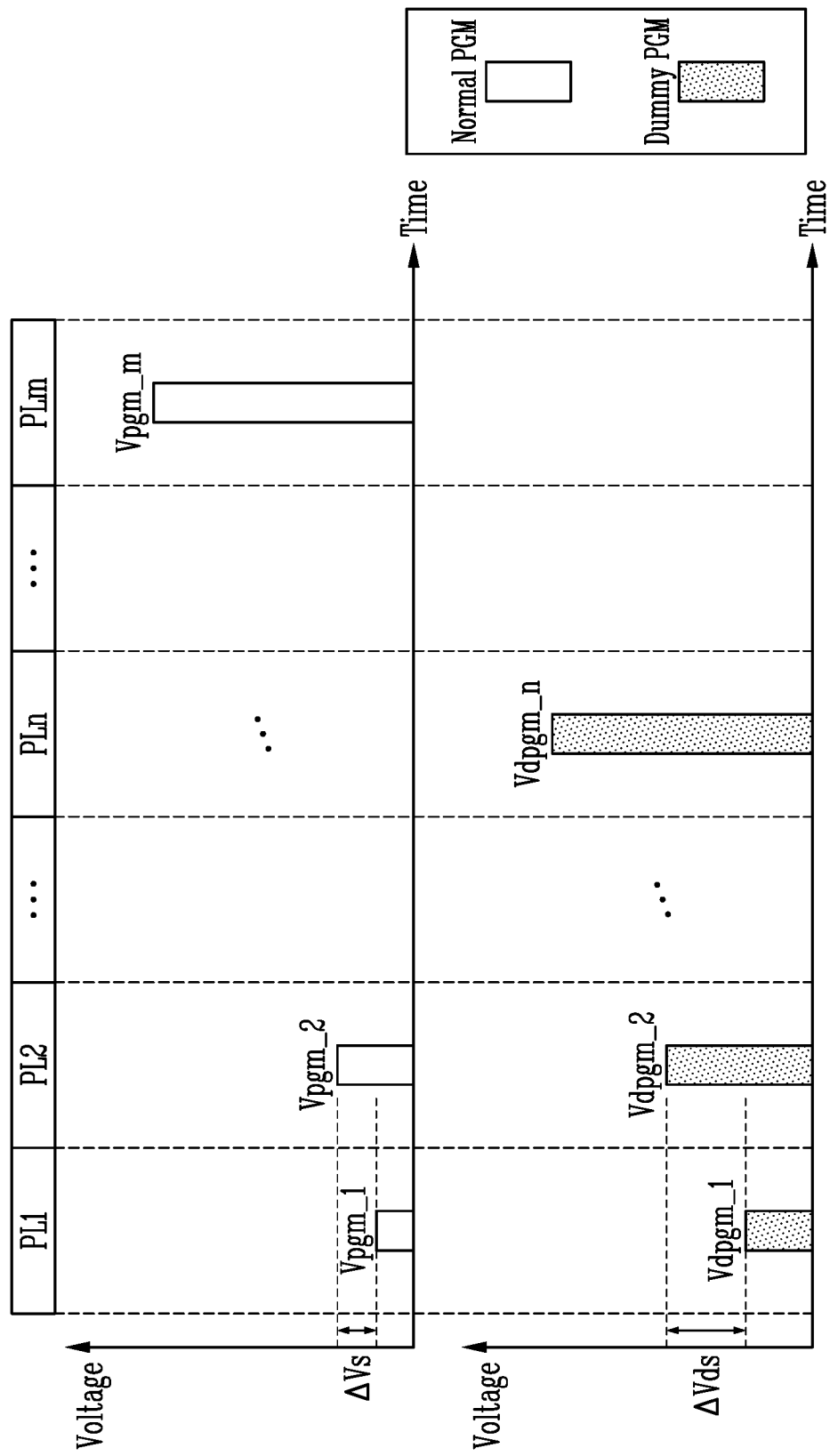
FIG. 9 is a diagram illustrating a normal program operation and a dummy program operation.

FIG. 9 is a diagram illustrating a normal program operation and a dummy program operation.

Referring to FIG. 9, first to mth program loops PL1 to PLm (m is a natural number greater than 1) may be performed in the normal program operation. First to nth program loops PL1 to PLn (n is a natural number which is greater than or equal to 1 and is less than m) may be performed in the dummy program operation.

A program start voltage Vdpgm 1 of the dummy program operation may be set higher than that Vpgm 1 of the normal program operation. A step voltage ΔVds of the dummy program operation may be set higher than that ΔVs of the normal program operation.

Since dummy data to be programmed in the dummy program operation during the recovery operation for the sudden power-off needs not be valid data, the dummy data operation may be coarsely performed, unlike the fine normal program operation in which valid data is programmed. That is, since the reliability of dummy data is not important, the dummy program operation may be performed in a smaller number of program loops by setting the program start voltage and the step voltage to be higher than those of the normal program operation. Since the dummy program operation is performed in a smaller number of program loops, as compared with the normal program operation, the dummy program operation may be performed within a shorter time than the normal program operation.

In various embodiments, since the dummy data needs not to be valid data, Error Correction Code (ECC) encoding and randomizing on the dummy data may be skipped to reduce the time required to perform the dummy program operation during the recovery operation for the sudden power-off.

Figure 10:
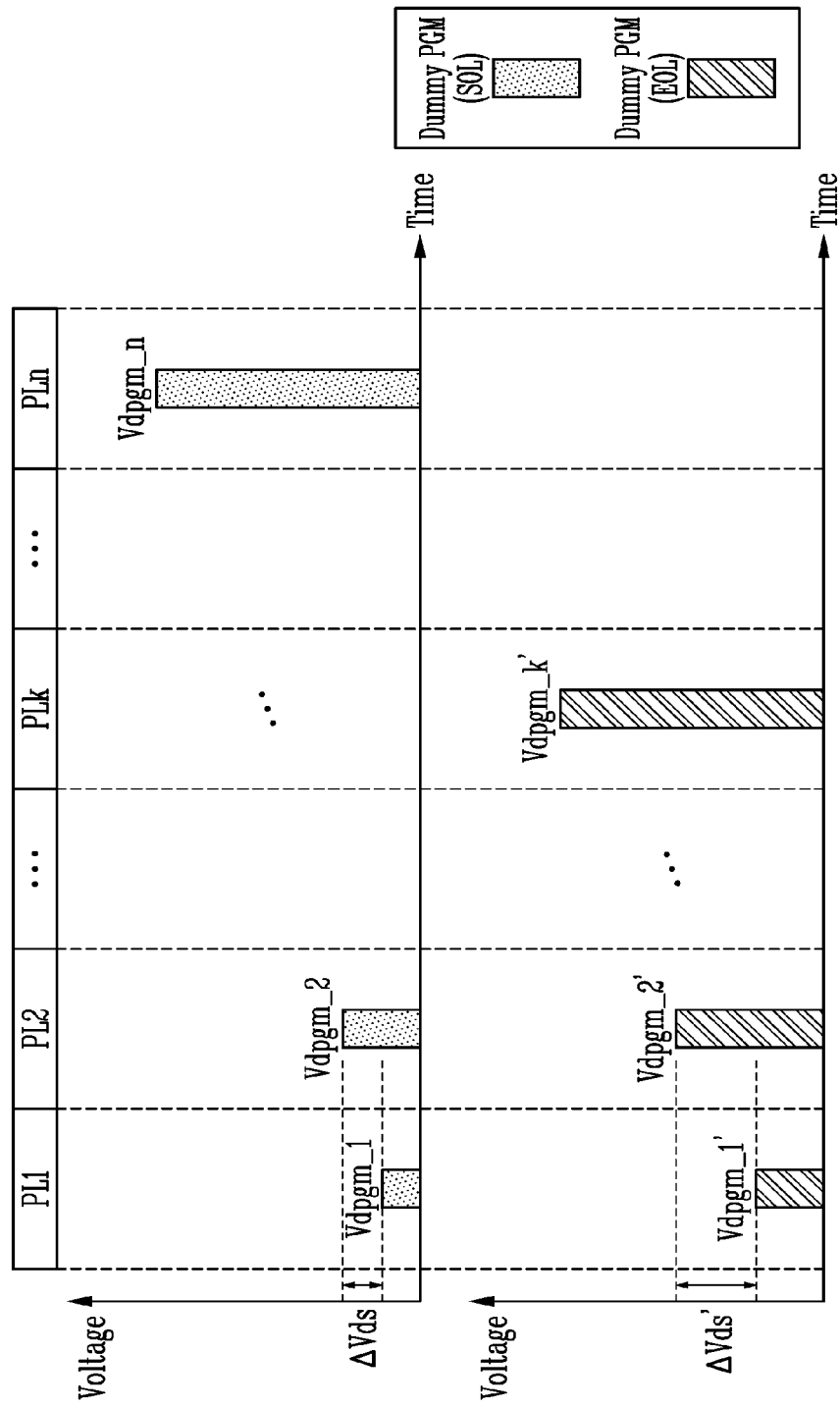
FIG. 10 is a diagram illustrating a dummy program operation according to a degree of degradation of a memory block.

FIG. 10 is a diagram illustrating a dummy program operation according to a degree of degradation of a memory block.

Referring to FIG. 10, the degree of degradation of the memory block may be low when the lifetime of the memory device is Start Of Life (SOL). The degree of degradation of the memory block may increase when the lifetime of the memory device is End Of Life (EOL).

When the degree of degradation of the memory block is low, first to nth program loops PL1 to PLn (n is a natural number greater than 1) may be performed in the dummy program operation. When the degree of degradation of the memory block is high, first to kth program loops PL1 to PLk (k is a natural number which is greater than or equal to 1 and is less than n) may be performed in the dummy program operation.

A program start voltage Vdpgm 1' of the dummy program operation when the degree of degradation of the memory block is high may be set higher than that Vdpgm of the dummy program operation when the degree of degradation of the memory block is low. A step voltage ΔVds' of the dummy program operation when the degree of degradation of the memory block is high may be set higher than that ΔVds of the dummy program operation when the degree of degradation of the memory block is low.

In an embodiment, the degree of degradation of the memory block may be determined based on at least one of a read count, an erase/write count, and a read reclaim count of the memory block.

That is, at least one of the program start voltage and the step voltage may be increased as the degree of degradation of the memory block increases since the lifetime of the memory device increases. Since a smaller number of program loops are performed as the degree of degradation of the memory block increases, the dummy program operation can be more rapidly performed during the recovery operation for the sudden power-off.

Figure 11:
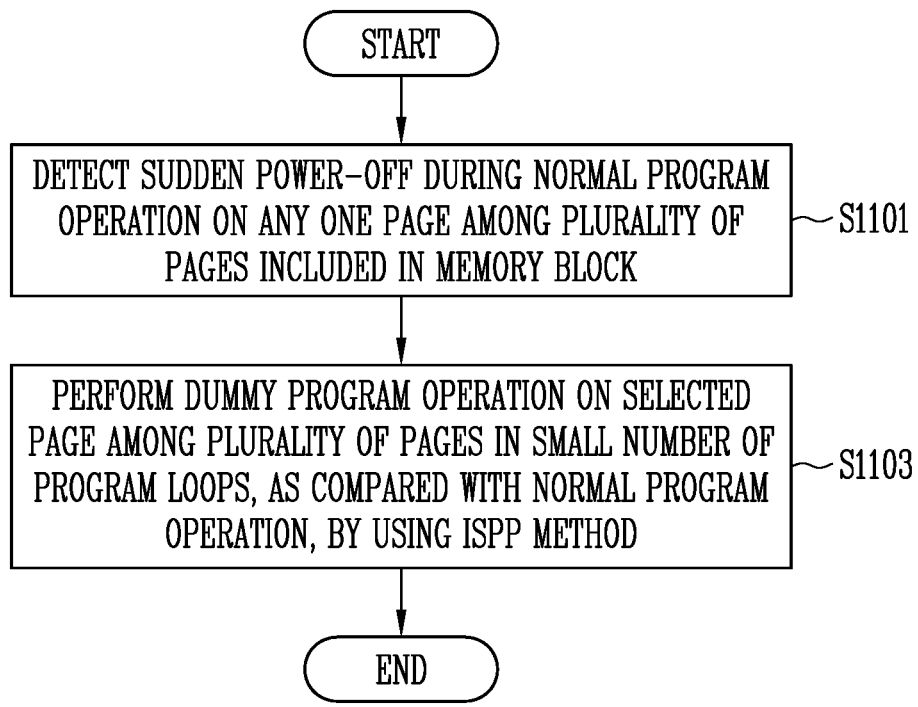
FIG. 11 is a flowchart illustrating an operation of the storage device in accordance with an embodiment of the present disclosure.

FIG. 11 is a flowchart illustrating an operation of the storage device in accordance with an embodiment of the present disclosure.

Referring to FIG. 11, in operation S1101, the storage device may detect a sudden power-off during a normal program operation on any page among a plurality of pages included in a memory block.

In operation S1103, the storage device may perform a dummy program operation on a selected page among the plurality of pages in a smaller number of program loops during the recovery operation for the sudden power-off, as compared with the normal program operation, by using an Incremental Step Pulse Program (ISPP) method. The storage device may set a program start voltage of the dummy program operation to be higher than that of the normal program operation. The storage device may set a step voltage of the dummy program operation to be higher than that of the normal program operation.

Figure 12:
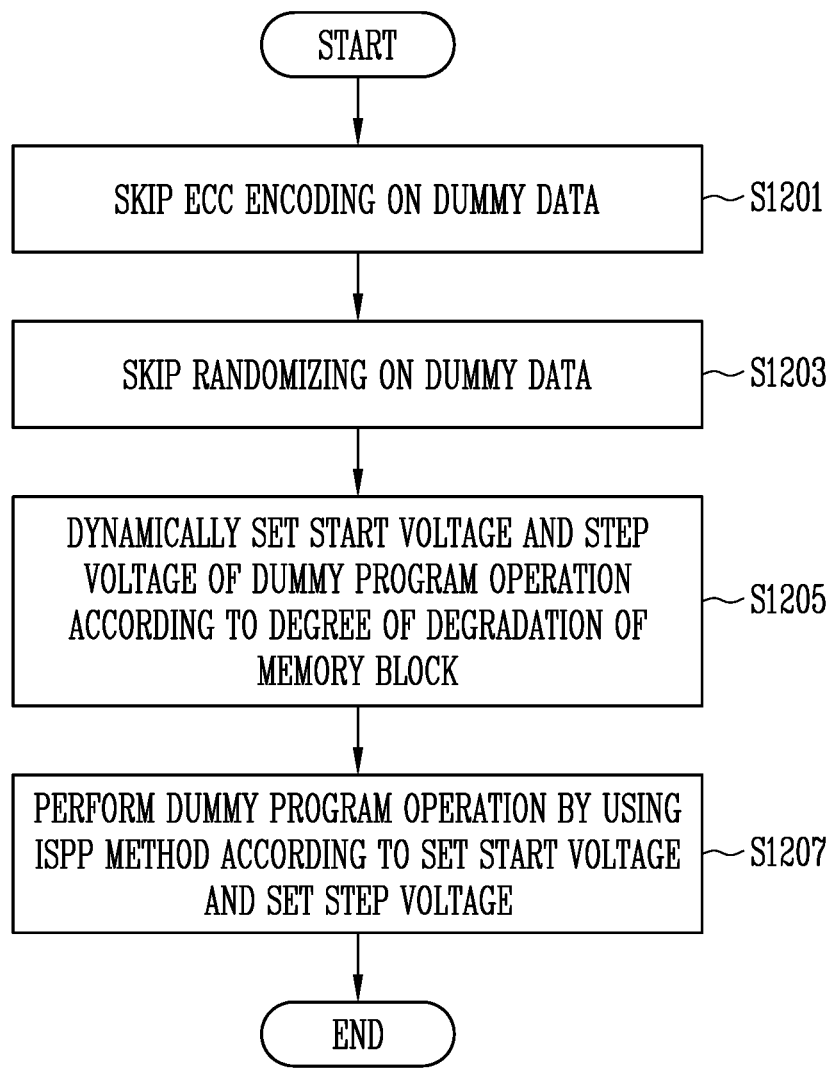
FIG. 12 is a flowchart illustrating an operation of the storage device in accordance with an embodiment of the present disclosure.

FIG. 12 is a flowchart illustrating an operation of the storage device in accordance with an embodiment of the present disclosure.

Referring to FIG. 12, in operation S1201, the storage device may skip Error Correction Code (ECC) encoding on dummy data during the recovery operation for the sudden power-off.

In operation S1203, the storage device may skip randomizing on the dummy data during the recovery operation for the sudden power-off.

In operation S1205, the storage device may dynamically set a program start voltage and a step voltage of a dummy program operation according to a degree of degradation of a memory block.

In operation S1207, the storage device may perform the dummy program operation during the recovery operation for the sudden power-off by using the ISPP method according to the set program start voltage and the set step voltage.

Figure 13:
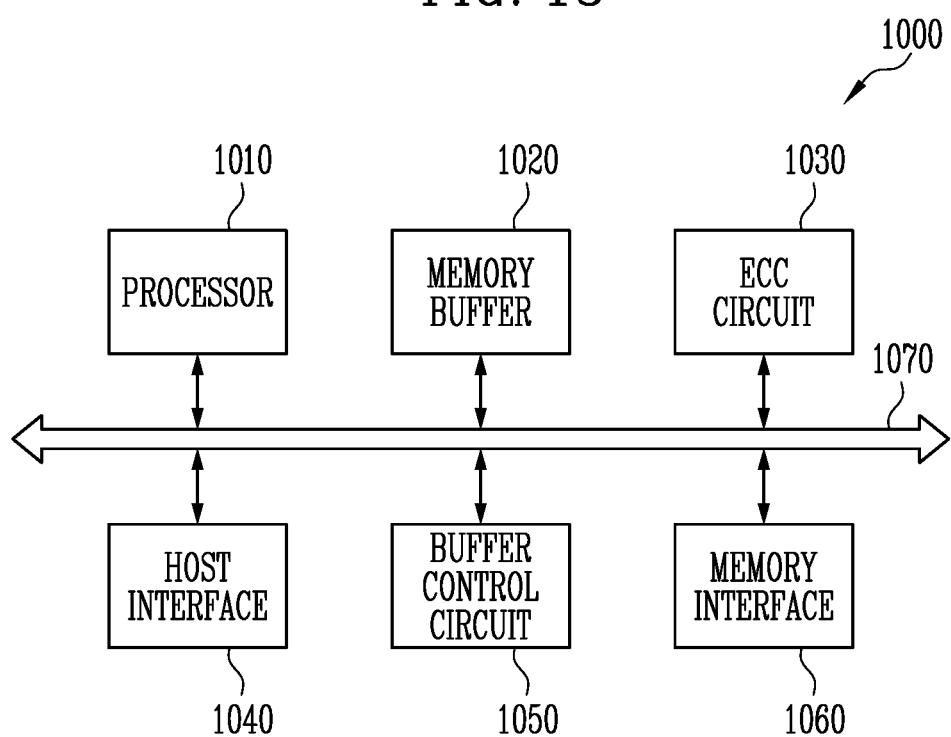
FIG. 13 is a diagram illustrating another embodiment of a memory controller shown in FIG. 1.

FIG. 13 is a diagram illustrating another embodiment of the memory controller shown in FIG. 1.

Referring to FIG. 13, a memory controller 1000 is connected to a host and a memory device. The memory controller 1000 may access the memory device in response to a request received from the host. For example, the memory controller 1000 may control write, read, erase, and background operations of the memory device. The memory controller 1000 may provide an interface between the memory device and the host. The memory controller 1000 may drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA then using a mapping table translate the LBA into a PBA. Several address mapping methods of the FTL exist according to mapping units. A representative address mapping method includes a page mapping method, a block mapping method, and a hybrid mapping method.

The processor 1010 may randomize data received from the host. For example, the processor 1010 may randomize data received from the host, using a randomizing seed. The randomized data is provided as data to be stored to the memory device to be programmed in the memory cell array.

In a read operation, the processor 1010 may derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a NonVolatile Memory Express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence each other. The data bus may be connected to the host interface 1040, the buffer control circuit 1050, the ECC circuit 1030, and the memory interface 1060. The control bus may be connected to the host interface 1040, the processor 1010, the buffer control circuit 1050, the memory buffer 1020, and the memory interface 1060.

In an embodiment, the power manager 210, the program operation controller 220, and the block manager 230, which are shown in FIG. 1, may be included in the processor 1010. The processor 110 may skip randomizing on dummy data to be programmed in the dummy program operation described in FIG. 8. The ECC circuit 1030 may skip ECC encoding on dummy data.

Figure 14:
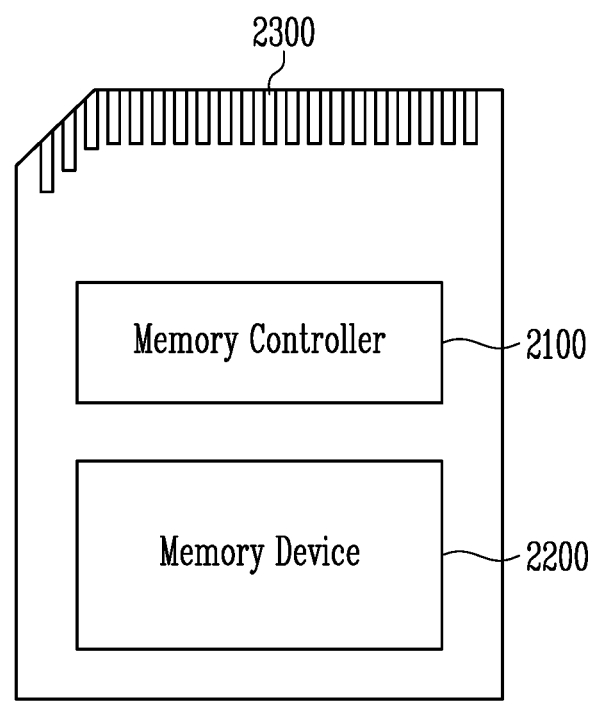
FIG. 14 is a block diagram illustrating a memory card system to which the storage device is applied in accordance with an embodiment of the present disclosure.

FIG. 14 is a block diagram illustrating a memory card system to which the storage device is applied in accordance with an embodiment of the present disclosure.

Referring to FIG. 14, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented identically to the memory controller 200 described with reference to FIG. 1.

Furthermore, the memory controller 2100 may include components such as a Random Access Memory (RAM), a processing unit, a host interface, a memory interface, and the error corrector.

The memory controller 2100 may communicate with an external device through the connector 2300. The memory controller 2100 may communicate with the external device (e.g., the host) according to a specific communication protocol. The memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 15:
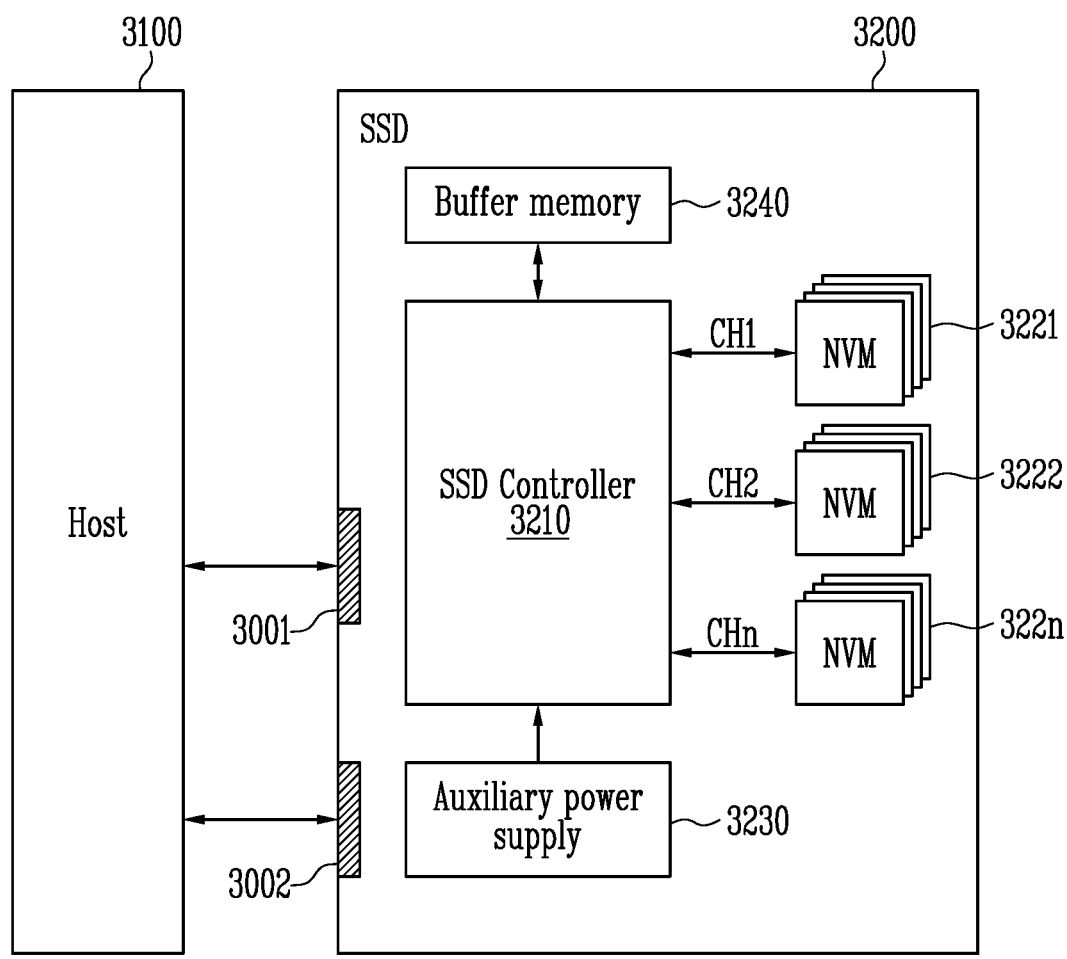
FIG. 15 is a block diagram illustrating a Solid State Drive (SDD) system to which the storage device is applied in accordance with an embodiment of the present disclosure.

FIG. 15 is a block diagram illustrating a Solid State Drive (SDD) system to which the storage device is applied in accordance with an embodiment of the present disclosure.

Referring to FIG. 15, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of nonvolatile memories 3221 to 322n, an auxiliary power supply 3230, and a buffer memory 3240.

In accordance with an embodiment of the present disclosure, the SSD controller 3210 may serve as the memory controller 200 described with reference to FIG. 1.

The SSD controller 3210 may control the plurality of nonvolatile memories 3221 to 322n in response to a signal SIG received from the host 3100. The signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), a firewire, a Universal Flash Storage (UFS), a WI-FI, a Bluetooth, and an NVMe.

The auxiliary power supply 3230 is connected to the host 3100 through the power connector 3002. When the supply of power from the host 3100 is not smooth, the auxiliary power supply 3230 may provide power of the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of nonvolatile memories 3221 to 322n, or temporarily store meta data (e.g., a mapping table) of the nonvolatile memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 16:
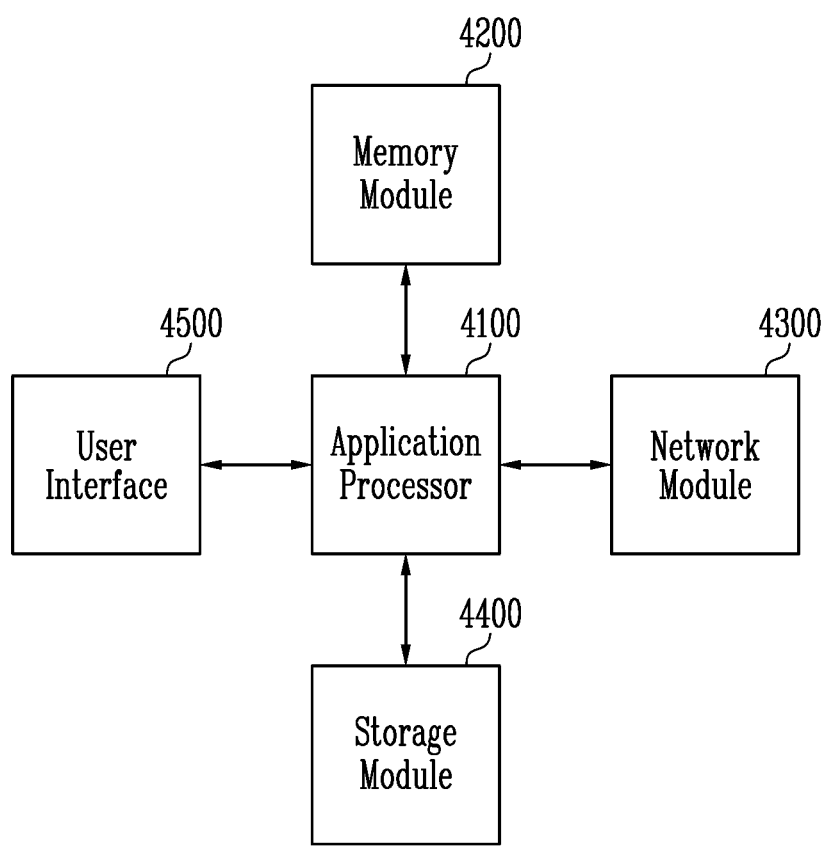
FIG. 16 is a block diagram illustrating a user system to which the storage device is applied in accordance with an embodiment of the present disclosure.

FIG. 16 is a block diagram illustrating a user system to which the storage device is applied in accordance with an embodiment of the present disclosure.

Referring to FIG. 16, the user system 4000 includes an application processor 4100, a memory module 4200, a network module 4300, a storage module 4400, and a user interface 4500.

The application processor 4100 may drive components included in the user system 4000, an operating system (OS), a user program, or the like. The application processor 4100 may include controllers for controlling components included in the user system 4000, interfaces, a graphic engine, and the like. The application processor 4100 may be provided as a System-on-Chip (SoC).

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 4100 and the memory module 4200 may be provided as one semiconductor package by being packaged based on a Package on Package (PoP).

The network module 4300 may communicate with external devices. The network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. The network module 4300 may be included in the application processor 4100.

The storage module 4400 may store data. For example, the storage module 4400 may store data received from the application processor 4100. Alternatively, the storage module 4400 may transmit data stored therein to the application processor 4100. The storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 4400 may be provided as a removable drive such as a memory card of the user system 4000 or an external drive.

The storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or commands to the application processor 4100 or outputting data to an external device. The user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, there can be provided a storage device having improved dummy program performance and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Various embodiments of the present disclosure have been described in the drawings and specification. Although specific terminologies are used here, the terminologies are used only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. Additions, subtractions, or modifications which are apparent in view of the present disclosure are intended to fall within the scope of the appended claims.

What is claimed is:

1. A storage device comprising:
a memory device including a memory block including a plurality of pages; and
a memory controller configured to, when a sudden power off is detected in which power supplied to the memory device is abnormally interrupted during a normal program operation on one page among the plurality of pages, control the memory device to perform a dummy program operation on a selected page among the plurality of pages after the sudden power-off,
wherein the memory controller controls the memory device to perform the normal program operation and the dummy program operation by using an Incremental Step Pulse Program (ISPP) method, and
wherein the memory controller controls the memory device to perform the dummy program operation in a smaller number of program loops as compared with the normal program operation.

2. The storage device of claim 1, wherein the memory controller sets a program start voltage of the dummy program operation to be higher than that of the normal program operation.

3. The storage device of claim 1, wherein the memory controller sets a step voltage of the dummy program operation to be higher than that of the normal program operation.

4. The storage device of claim 1, wherein the memory controller performs Error Correction Code (ECC) encoding on data to be programmed in the normal program operation and skips the ECC encoding on dummy data to be programmed in the dummy program operation.

5. The storage device of claim 1, wherein the memory controller performs randomizing on data to be programmed in the normal program operation and skips the randomizing on dummy data to be programmed in the dummy program operation.

6. The storage device of claim 1, wherein the memory controller dynamically sets a program start voltage and a step voltage of the dummy program operation according to a degree of degradation of the memory block.

7. The storage device of claim 6, wherein, in the dummy program operation, the memory controller increases at least one of the program start voltage and the step voltage as the degree of degradation of the memory block increases.

8. The storage device of claim 6, wherein the memory controller determines the degree of degradation of the memory block based on at least one of a read count, an erase/write count, and a read reclaim count of the memory block.

9. The storage device of claim 1, wherein the memory controller determines the selected page based on a first erased page next to the one page among the plurality of pages.

10. A method for operating a storage device including a memory block including a plurality of pages, the method comprising:
detecting a sudden power-off in which power supplied to the storage device is abnormally interrupted during a normal program operation on one page among the plurality of pages; and
performing a dummy program operation on a selected page among the plurality of pages after the sudden power-off,
wherein the normal program operation and the dummy program operation are performed by using an Incremental Step Pulse Program (ISPP) method, and
wherein the dummy program operation is performed in a smaller number of program loops as compared with the normal program operation.

11. The method of claim 10, wherein the performing of the dummy program operation includes setting a program start voltage of the dummy program operation to be higher than that of the normal program operation or setting a step voltage of the dummy program operation to be higher than that of the normal program operation.

12. The method of claim 11,
wherein the setting of the program start voltage includes increasing the program start voltage according to a degree of degradation of the memory block, and
wherein the setting of the step voltage includes increasing the step voltage according to the degree of degradation of the memory block.

13. The method of claim 10, further comprising selectively performing Error Correction Code (ECC) encoding on data to be programmed according to whether a program operation is the normal program operation or the dummy program operation.

14. The method of claim 10, further comprising selectively performing randomizing on data to be programmed according to whether a program operation is the normal program operation or the dummy program operation.

15. The method of claim 12, further comprising determining the degree of degradation of the memory block based on at least one of a read count, an erase/write count, and a read reclaim count of the memory block.

16. The method of claim 10, wherein the performing of the dummy program operation includes determining the selected page, based on a first erased page next to the one page among the plurality of pages.

17. A memory controller for controlling a memory device including a memory block, the memory controller comprising:
- a power manager configured to generate power-off information when a sudden power-off is detected in which power supplied to the memory device is abnormally interrupted during a normal program operation on one page among the plurality of pages; and
- a program operation controller configured to control, when the power-off information is received, the memory device to perform a dummy program operation on a selected page among a plurality of pages included in the memory device after the sudden power-off,
- wherein the program operation controller controls the memory device to perform the normal program operation and the dummy program operation by using an Incremental Step Pulse Program (ISPP) method, and
- wherein the program operation controller controls the memory device to perform the dummy program operation in a smaller number of program loops as compared with the normal program operation.

18. The memory controller of claim 17, wherein the program operation controller sets a program start voltage of the dummy program operation to be higher than that of the normal program operation or sets a step voltage of the dummy program operation to be higher than that of the normal program operation.

19. The memory controller of claim 17, wherein Error Correction Code (ECC) encoding and randomizing on dummy data to be programmed in the dummy program operation are skipped.

20. The memory controller of claim 17,
- further comprising a block manager configured to determine a degree of degradation of the memory block based on at least one of a read count, an erase/write count, and a read reclaim count of the memory block,
- wherein the program operation controller increases at least one of a program start voltage and a step voltage of the dummy program operation according to the degree of degradation of the memory block.

* * * * *